US008848164B2

(12) United States Patent
Van Bokhoven et al.

(10) Patent No.: US 8,848,164 B2
(45) Date of Patent: Sep. 30, 2014

(54) FLUID SUPPLY SYSTEM, A LITHOGRAPHIC APPARATUS, A METHOD OF VARYING FLUID FLOW RATE AND A DEVICE MANUFACTURING METHOD

(75) Inventors: Laurentius Johannes Adrianus Van Bokhoven, Veldhoven (NL); Nicolaas Ten Kate, Almkerk (NL); Pieter Jacob Kramer, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 327 days.

(21) Appl. No.: 13/149,251

(22) Filed: May 31, 2011

(65) Prior Publication Data

US 2011/0299051 A1   Dec. 8, 2011

Related U.S. Application Data

(60) Provisional application No. 61/350,359, filed on Jun. 1, 2010.

(51) Int. Cl.
  *G03B 27/52* (2006.01)
  *G03B 27/42* (2006.01)
  *G03F 7/20* (2006.01)

(52) U.S. Cl.
  CPC ................... *G03F 7/70341* (2013.01)
  USPC .............................. 355/30; 355/53

(58) Field of Classification Search
  CPC .................................. G03F 7/70431
  USPC ................. 355/30, 53, 72; 250/548
  See application file for complete search history.

(56) References Cited

U.S. PATENT DOCUMENTS 4,509,852 A     4/1985   Tabarelli et al.
6,297,871 B1 *  10/2001  Hagiwara ........................ 355/30
(Continued)

FOREIGN PATENT DOCUMENTS

EP      1 420 300       5/2004
JP      2007-515646     6/2007
(Continued)

OTHER PUBLICATIONS

Japanese Office Action mailed Nov. 6, 2012 in corresponding Japanese Patent Application No. 2011-120315.

*Primary Examiner* — Hung Henry Nguyen
(74) *Attorney, Agent, or Firm* — Pillsbury Winthrop Shaw Pittman LLP (57) ABSTRACT

A fluid supply system for a lithographic apparatus includes a first fluid flow path for fluid between a fluid source and a first component and a drain fluid flow path for fluid flow from a junction in the first fluid flow path to a drain component. A controller is provided to vary a fluid flow rate to the first component from the fluid source by regulating flow of fluid through the drain fluid flow path.

21 Claims, 5 Drawing Sheets

(56) References Cited

U.S. PATENT DOCUMENTS

| | | |
|---|---|---|
| 7,352,437 B2 * | 4/2008 | Nomoto ............... 355/53 |
| 8,004,652 B2 * | 8/2011 | Mertens et al. ............ 355/53 |
| 8,243,255 B2 * | 8/2012 | De Graaf et al. ........... 355/30 |
| 2004/0136494 A1 | 7/2004 | Lof et al. |
| 2004/0207824 A1 | 10/2004 | Lof et al. |
| 2006/0038968 A1 | 2/2006 | Kemper et al. |
| 2006/0119809 A1 | 6/2006 | Verhagen et al. |
| 2008/0073602 A1 | 3/2008 | Jacobs et al. |
| 2009/0195761 A1 | 8/2009 | De Graaf et al. |
| 2009/0279062 A1 | 11/2009 | Direcks et al. |
| 2010/0045951 A1 | 2/2010 | Martens et al. |
| 2010/0060868 A1 | 3/2010 | Tanasa et al. |
| 2010/0208221 A1 * | 8/2010 | Kramer et al. ............... 355/30 |

FOREIGN PATENT DOCUMENTS

| | | |
|---|---|---|
| JP | 2007-180450 | 7/2007 |
| JP | 2008-130230 | 6/2008 |
| JP | 2009-164642 | 7/2009 |
| JP | 2009-177143 | 8/2009 |
| JP | 2010-050455 | 3/2010 |
| JP | 2010-087191 | 4/2010 |
| WO | 99/49504 | 9/1999 |
| WO | 2005/064405 | 7/2005 |
| WO | 2005/124835 | 12/2005 |
| WO | 2007/023813 | 3/2007 |

* cited by examiner

FIG. 1

-- PRIOR ART --

FIG. 2

-- PRIOR ART --

FIG. 3

-- PRIOR ART --

FIG. 4

-- PRIOR ART --

FLUID SUPPLY SYSTEM, A LITHOGRAPHIC APPARATUS, A METHOD OF VARYING FLUID FLOW RATE AND A DEVICE MANUFACTURING METHOD

This application claims priority and benefit under 35 U.S.C. §119(e) to U.S. Provisional Patent Application No. 61/350,359, entitled "A Fluid Supply System, A Lithographic Apparatus, A Method Of Varying Fluid Flow Rate and A Device Manufacturing Method", filed on Jun. 1, 2010. The content of that application is incorporated herein in its entirety by reference.

FIELD

The present invention relates to a fluid supply system, a lithographic apparatus, a method of varying fluid flow rate and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In immersion lithography, temperature variation in the immersion liquid can result in imaging defects because of the high sensitivity of refractive index of the immersion liquid to the temperature of immersion liquid.

It is desirable, for example, to reduce or eliminate temperature variation in immersion liquid being supplied to or in a lithographic apparatus.

According to an aspect, there is provided a fluid supply system for a lithographic apparatus, comprising: a first fluid flow path for fluid between a fluid source and a first component; a drain fluid flow path for fluid flow from a junction in the first fluid flow path to a drain component; and a first controller configured to vary a fluid flow rate to the first component from the fluid source by regulating flow of fluid through the drain fluid flow path.

According to an aspect, there is provided a method of varying the fluid flow rate to a component from a fluid source, the method comprising varying the fluid flow in a drain fluid flow path between a drain component and a junction in a first fluid flow path between the fluid source and the component.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
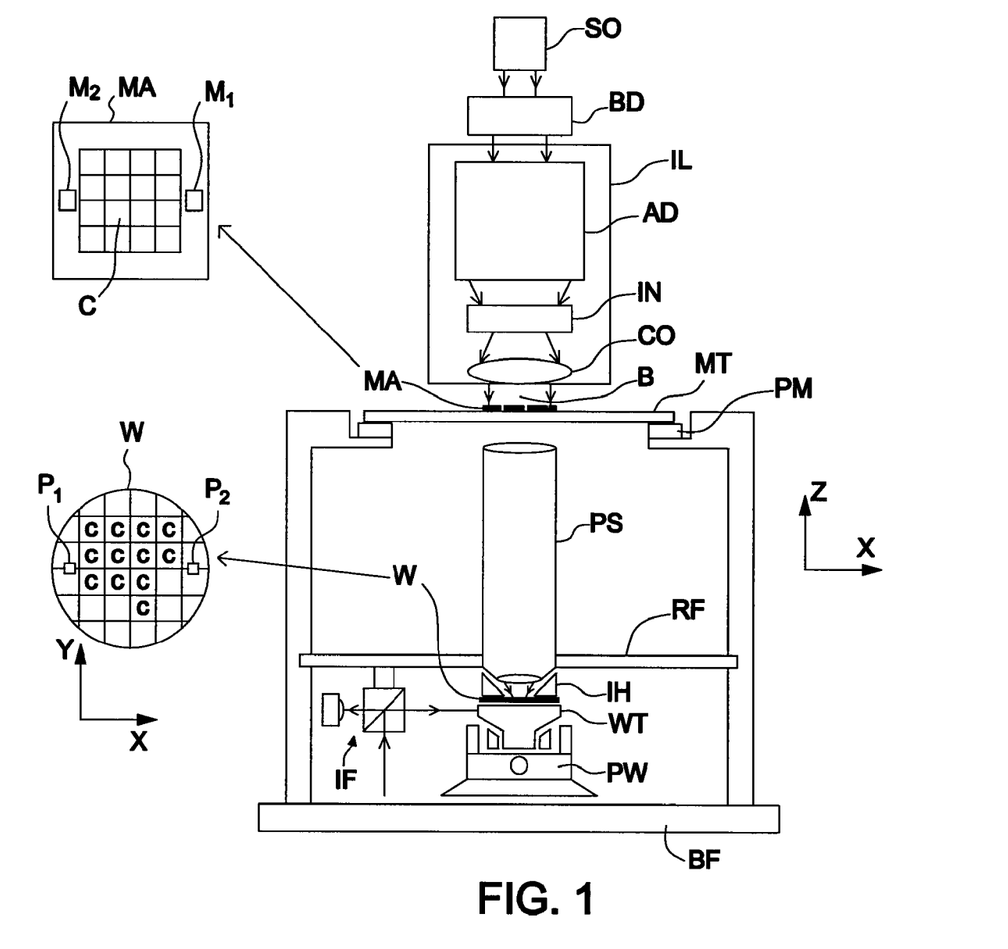
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables at least one or all of which may hold a substrate (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
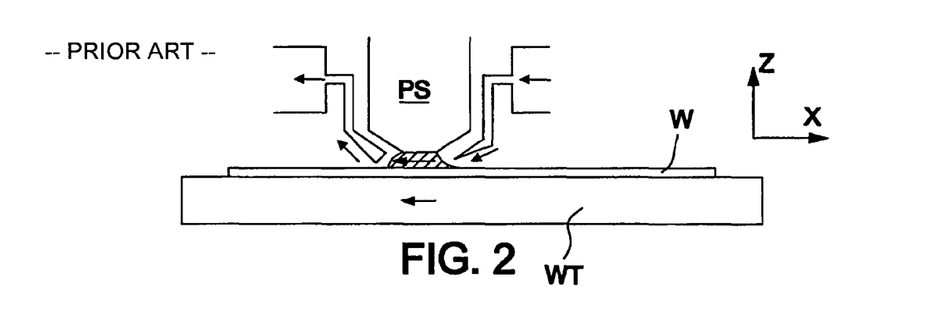
FIGS. 2 and 3 depict a liquid supply system for use in a lithographic projection apparatus.
Figure 3:
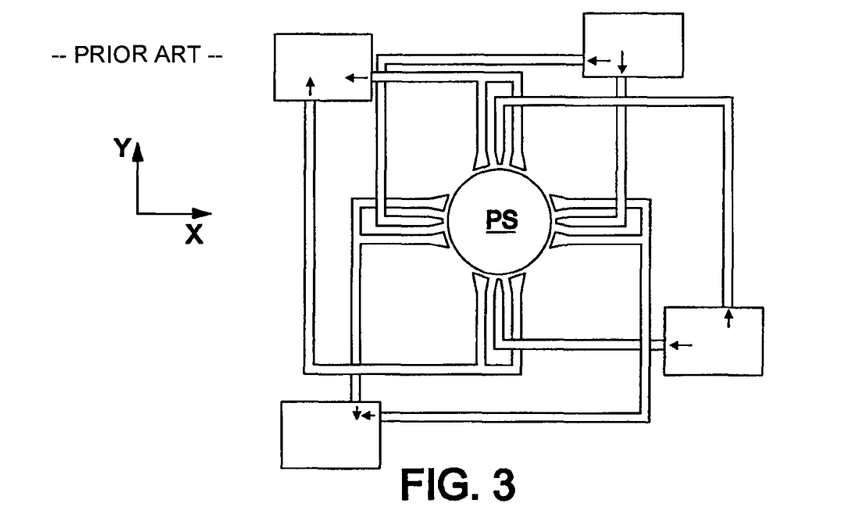

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
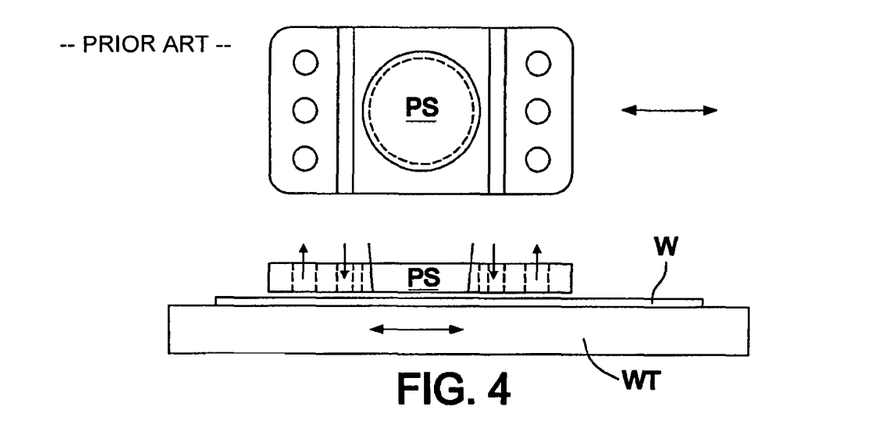
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present.

In an arrangement, the apparatus has only one table, or has two tables of which only one can support a substrate.

PCT patent application publication no. WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Figure 5:
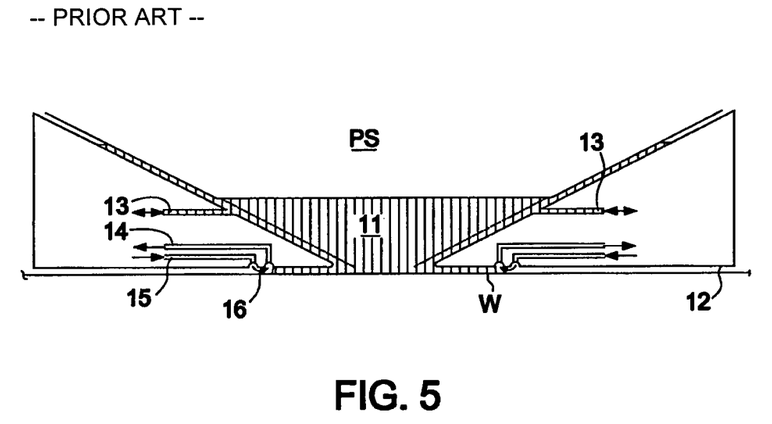
FIG. 5 depicts a further liquid supply system for use in a lithographic projection apparatus.

Another arrangement which has been proposed is to provide the liquid supply system with a fluid handling structure. The fluid handling structure may extend along at least a part of a boundary of the space between the final element of the projection system and the substrate table. Such an arrangement is illustrated in FIG. 5. The fluid handling structure is substantially stationary relative to the projection system in the XY plane though there may be some relative movement in the Z direction (in the direction of the optical axis). A seal is formed between the fluid handling structure and the surface of the substrate. In an embodiment, a seal is formed between the fluid handling structure and the surface of the substrate and may be a contactless seal such as a gas seal. Such a system is disclosed in United States patent application publication no. US 2004-0207824. In another embodiment the fluid handling structure has a seal which is a non-gaseous seal, and so may be referred to as a liquid confinement structure.

FIG. 5 schematically depicts a localized liquid supply system with a fluid handling structure or device. A body 12 of the fluid handling structure forms a barrier member or liquid confinement structure, which extends along at least a part of a boundary of the space 11 between the final element of the projection system PS and the substrate table WT or substrate W. (Please note that, because the surface of the substrate W may be co-planar with the substrate table WT, reference in the following text to surface of the substrate W also refers in addition or in the alternative to a surface of the substrate table WT, unless expressly stated otherwise.) The fluid handling structure is substantially stationary relative to the projection system PS in the XY plane though there may be some relative movement in the Z direction (generally in the direction of the optical axis). In an embodiment, a seal is formed between the body 12 and the surface of the substrate W and may be a contactless seal such as a gas seal or fluid seal.

The fluid handling structure at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling structures which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly lyophilic (e.g., hydrophilic), i.e. having a contact angle of less than 90° to the immersion liquid, e.g. water.

Many other types of liquid supply system are possible, for example a gas drag arrangement where a liquid meniscus is pinned at outlet openings by two phase extraction such as is disclosed in United States patent application publication no. US 2009-0279062, hereby incorporated in its entirety by reference. An embodiment of the present invention is not limited to any particular type of liquid supply system. An embodiment of the present invention may be advantageous for use with a confined immersion system in which the liquid between the final element of the projection system and the substrate is confined, for example, in optimizing the use. However, an embodiment of the invention can be used with any other type of liquid supply system.

In an immersion lithography apparatus, fluid is typically supplied to the fluid handling system. If the fluid supplied is the fluid for the immersion space (that is the immersion fluid) it is desirable to control the temperature of that fluid carefully, especially if it is liquid or another substantially incompressible fluid for the immersion space. For example, the temperature accuracy may be of the order of less than 50 mK. This is because of the high sensitivity of the refractive index of the immersion fluid to fluid temperature. A difference in temperature may cause a change in refractive index which may cause an imaging defect. Additionally fast fluid flow control with minimal risks of contamination for immersion lithography systems is desirable.

Some operations in an immersion lithographic apparatus may require a change in flow rate of immersion liquid. Such a change of flow may be a change between static flow rates. A static flow rate is a flow rate which is substantially constant over a period of time. For example, such a change may occur when a shutter member, such as a closing surface for example a dummy substrate (or closing disk), is placed under the liquid handling system during, e.g., substrate swap. The presence of a shutter member under the liquid handling structure maintains liquid in the immersion space 11. Keeping liquid in the immersion space avoids having to empty and refill the immersion space which could cause drying stains on a drying surface of the immersion space (including the projection system) or temperature fluctuation as a consequence of a droplet evaporating from the surface of the immersion space. However, for example, during substrate swap a reduced rate of immersion liquid flow may be desired. The flow rate of supplied liquid during exposure may have a substantially constant flow rate; the flow rate of supplied liquid during, e.g., substrate swap may be at a different, e.g. substantially constant, flow rate.

Another type of shutter member is, for example, a bridge which extends between two tables during, e.g., substrate swap such as a first substrate table carrying a first substrate and a second substrate carrying a second substrate. When the first substrate is swapped for the second substrate under the projection system, the liquid handling system is maintained full. The first substrate table is moved from under the projection system so that the bridge passes under the projection system followed by the second substrate table. In this way a surface always opposes the bottom of the liquid handling system, so that the surface defines in part the space in which liquid is confined. There may be a gap or groove in a joint between the substrate tables and the bridge. To reduce the risk of liquid leaking from the fluid handling structure, or of a bubble being generated in the liquid in the liquid handling system, the flow rate of liquid supplied to the immersion space may be reduced. Another example of where a varying liquid flow rate may be desired is one or more cooling channels in a substrate table.

Some fluid handling structures of an immersion lithographic apparatus involve switching of fluid flow from one opening to another and/or increasing and/or decreasing fluid flow through a given opening. For example, United States patent application publication no. US 2008-0073602 discloses an immersion lithographic apparatus in which a liquid removal system surrounds a liquid supply system. The liquid supply system provides bulk liquid to a space between a projection system PS and a substrate W. The liquid removal system is moveable relative to the liquid supply system and is controlled to have substantially zero velocity relative to the moving substrate table. The gap between the liquid supply system and the liquid removal system may be covered and the atmosphere between the liquid supply system and the liquid removal system above the substrate table may be maintained such that the vapor pressure of the liquid is relatively high. Different flow rates out of the liquid supply system may be required around the periphery of the liquid supply system depending upon the position of the liquid supply system relative to the liquid removal system. In another example, United States patent application publication no. US 2010-0060868 discloses a system in which an opening of the fluid handling structure surrounds the space between the projection system and the substrate. The opening is segmented and, dependent upon the position of the fluid handling structure over the substrate table fluid is directed through one or more of the openings and/or the flow rate through one or more openings is varied.

Flow control may be based on switching valves in a first flow path for fluid between a fluid source and a first component (e.g. a fluid handling system or liquid confinement structure). Disadvantages to flow control based on switching valves would be: i) strong pressure pulses induced by the switching valves; ii) contamination from the switching valves and from the stainless steel restrictions present in the different sub-branches; iii) the labor involved in adjusting the different parameters so as to obtain the desired flow rates at the outlet; iv) little flexibility, i.e. different flow rates require different flow resistances and re-adjustment (so labor). It must be possible to change flow rate from an opening between 0.25 and 2.5 l/min at rates of the order of 1 l/min/s while at the same time nurturing mK stability of the outgoing flow. It is believed that no commercial liquid flow controller exists with the above performance. If only the flow specifications are to be met then commercial controllers are available. The main problem is achieving mK stability while varying flow rate as specified above.

Figure 6:
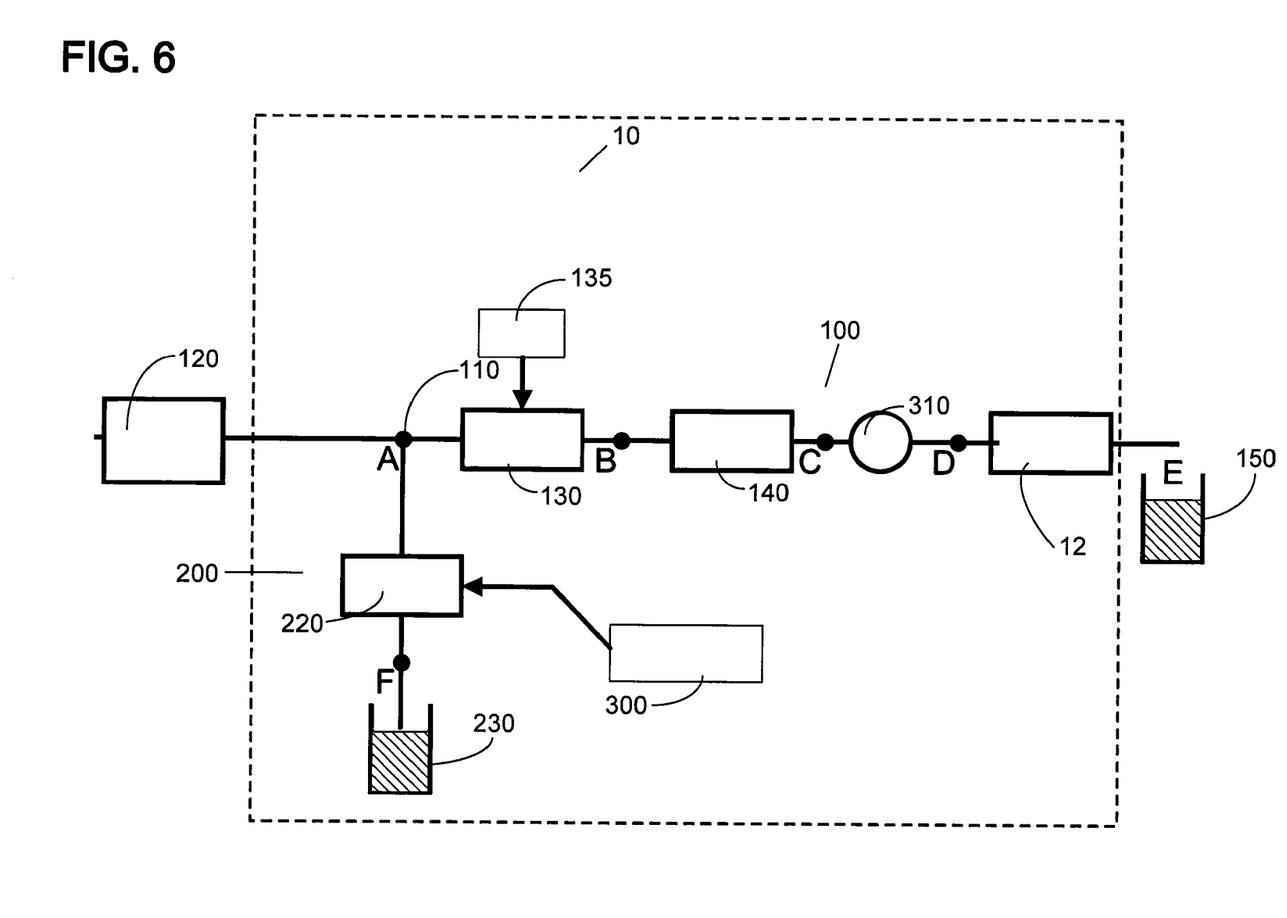
FIG. 6 illustrates schematically a fluid supply system of an embodiment of the present invention.

In order to achieve the liquid flow control but also to eliminate one or more disadvantages of a switching system, it is proposed to use a configuration as given in FIG. 6.

The fluid supply system 10 of FIG. 6 comprises a first fluid flow path 100. The first fluid flow path 100 is for fluid. In an embodiment the fluid is a liquid, such as water. The first fluid flow path 100 is between a fluid source 120 and a first component. Fluid is supplied to the fluid source 120 at a fixed inlet pressure. In an embodiment, the fluid source provides well-conditioned ultra pure water (mK stable) to a junction 110 at a (nearly) fixed rate. The first component may, for example, be a fluid handling structure 12 such as that illustrated in any of FIGS. 2-5. The fluid supply system 10 may be used to supply fluid to any component of a lithographic apparatus.

A (second) drain fluid flow path 200 is also provided. The drain fluid flow path 200 is for fluid. The drain fluid flow path 200 connects the first fluid flow path 100 at the junction 110 to a drain component 230. The junction 110 is between the fluid source 120 and the first component 12. The drain component 230 may be a drain or may be a recycling system which recycles liquid to the fluid source 120.

A mechanism 220 to regulate flow of fluid is provided in the drain fluid flow path 200. A first controller 300 is used to control the mechanism to regulate flow of fluid 220. In an embodiment, the mechanism to regulate flow of fluid 220 may be a mass flow controller. A mass flow controller may be a variable restriction in the flow path with a flow sensor downstream of the restriction. A controller of the mass flow controller typically adjusts the restriction to achieve the required flow using feedback based on a signal from the flow sensor indicative of flow rate downstream of the restriction. A controller, for example a first controller 300, instructs the controller of the mass flow controller of the desired flow rate.

A flow sensor 310 is provided in the first fluid flow path 100 to measure fluid flow to the first component.

The flow rate to the junction 110 is slightly larger than the maximum flow rate required at the outlet of the supply branch 100. The idea is to achieve the desired flow rate $\phi_s$ in the supply branch AE by regulating the flow in the drain branch AF using an actuator. An advantage of this solution is as follows. Firstly, a heat load (produced by the actuator) may be eliminated. Such a heat load may otherwise disturb the temperature of the flow in the supply branch. Second, it may be possible to reduce, if not minimize, the risk for contamination. The risk of contamination may be reduced by having only passive components in the first fluid flow path AE (so that there is no valve where particles are shed or accumulate). In an embodiment all components are made from a high-purity fluorocarbon resin, thereby reducing risk of contamination. Third, the system can be used to deliver a whole range of flow rates rather than a certain number, e.g. two, fixed flow rates, so the solution has improved flexibility. (It should be noted in increasing the number of fixed flow rates, the complexity of the fluid supply system may become increasing complex. The present arrangement avoids this problem.) Fourth, instead of producing pressure pulses on a change of flow rate, smooth changes in pressure may be achieved.

In an embodiment the flow sensor 310 is compatible with the immersion liquid (e.g. ultra pure water). The flow sensor may be a vortex flow sensor, a thermal flow meter, a pressure loss flow meter or an ultrasonic flow sensor, for example. A signal indicative of the flow of liquid in the first fluid flow path 100 is provided to the first controller 300 by the flow sensor 310. The flow sensor 310 is provided downstream of the junction 110 and upstream of the first component 12. In an embodiment the flow sensor 310 is provided directly upstream of the first component 12. Based on the signal from the flow sensor 310, the first controller 300 adjusts the mechanism 220 to regulate flow of fluid. For example, in order to increase flow to the first component 12, the first controller 300 reduces the flow rate through the mechanism 220 to regulate flow of fluid in the drain path 200. In order to decrease the flow of fluid to the first component 12, the first controller 300 increases the flow of fluid through the mechanism 220 to regulate the flow of fluid. Therefore, the first controller 300 is configured to vary the fluid flow rate to the first component 12 from the fluid source 120 by regulating flow of fluid through the drain fluid flow path 200.

In an embodiment the first controller 300 refers to a look-up table to determine whether and, if so, how to change the mechanism 200 to regulate flow of fluid based on the difference between the measured flow as determined by the flow sensor 310 and a desired flow rate. In an embodiment the look-up tables relate a desired flow rate to the first component 12 to a certain setting of the mechanism 220 to regulate flow of fluid. In an embodiment the flow sensor 310 is not necessary.

In an embodiment the mechanism 220 to regulate flow of fluid is adjusted under the control of the first controller 300. The mechanism 220 to regulate flow of fluid senses the flow rate through it and thereby through the drain branch 200. The measured flow rate in the drain branch 200 is used to set the mechanism 220 to regulate flow of fluid. Thus the desired flow in supply branch 100 is achieved by knowledge of how the change in flow in the drain branch 200 will affect flow in the supply branch 100. This embodiment uses manual feedback involving only the drain branch.

In an embodiment the mechanism 220 to regulate flow of fluid is adjusted through input from the first controller 300. The flow sensor 310 measures the flow rate in the first branch 100. An operator uses the output from the flow sensor 310 to adjust the set-point sent by the first controller 300 to the mechanism 220 to regulate flow of fluid. This is manual feedback involving the first branch 100 and the drain branch 200.

In an embodiment the first controller 300 works on a feedback system. The mechanism 220 to regulate flow of fluid is controlled by a signal from the first controller 300. The first controller 300 compares the user-defined set-point to the signal from the flow sensor 310 and if necessary adjust its set-point which is provided to the mechanism 220 to regulate flow of fluid. This is a feedback control loop.

In an embodiment a back pressure regulator 130 is provided downstream of the junction 110. The back pressure regulator 130 may be an electronic back pressure regulator. The back pressure regulator 130 controls the pressure at the junction 110 to be constant. If the pressure at the junction 110 is not constant, this may result in unstable flow because as the pressure at the junction 110 changes, flow from the fluid supply 120 and through the mechanism 220 to regulate flow of fluid could be varied. A controller 135 is provided to generate a signal indicative of the required pressure the back pressure regulator 130 should achieve.

In an embodiment the fluid flow rate to the first component 12 is varied only by regulating flow of fluid through the drain fluid flow path 200. In an embodiment the first fluid flow path 100 comprises only passive components. In an embodiment no components in the first fluid flow path 100 or at least between the junction 110 and the first component 12 are active. In an embodiment no components are provided between the junction 110 and the first component 12 in the first fluid flow path 100 which actively vary the flow rate of fluid between the junction 110 and the first component 12.

Figure 7:
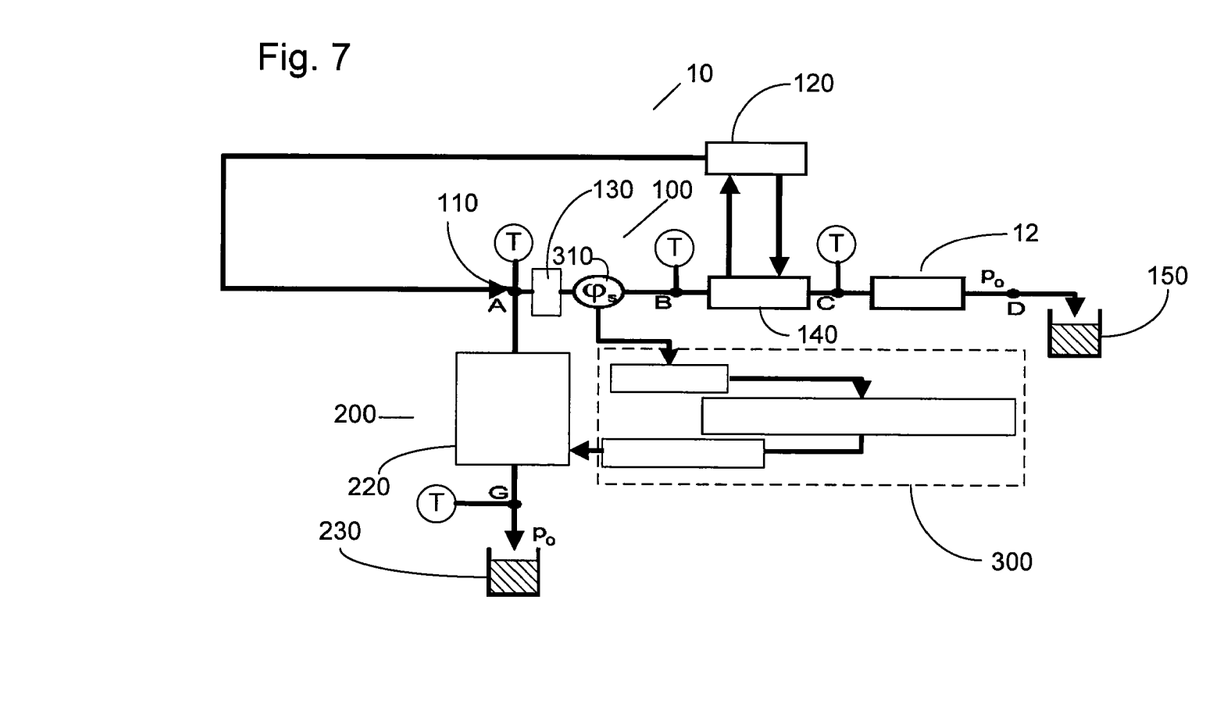
FIG. 7 illustrates schematically a fluid supply system of an embodiment of the present invention.

A heat exchanger 140 is provided downstream of the junction 110 and upstream of the first component 12. In an embodiment the heat exchanger 140 is provided with heat exchange fluid from the liquid source 120 as illustrated in FIG. 7. This helps in ensuring a stable temperature of liquid supplied to the first component 12. A drain 150 downstream of the first component 12 is also illustrated. For example, a fluid handling structure 12 may collect liquid, for example by a fluid removal system, and provide the liquid to the drain 150. The drain may be for fluid disposal or may be for fluid re-cycling back to the fluid supply 120.

In an embodiment the mechanism 220 to regulate flow of fluid through the drain fluid flow path 200 is a mass flow controller. The mass flow controller may be continuously or semi-continuously variable. A semi-continuously variable mass flow controller is one which can vary the mass flow rate in steps between no flow and maximum flow. A semi-continuously variable mass flow controller varies the mass flow rate through it in several steps more than just on and off.

In an embodiment the first controller 300 regulates the flow of fluid through the drain fluid flow path 200 based on feedback control. The set-point for the desired flow rate in the first fluid flow path AE is converted to a certain electrical signal by the first controller 300. The electrical signal is sent to the mechanism 220 to regulate fluid flow and flow rates in the first and second fluid flow paths 100, 200 (AE and AF) change accordingly. The actual flow rate in the first fluid flow path 100 is measured with the (e.g. ultrasonic) flow sensor 310. The measurement signal is returned to the first controller 300. The actual flow rate is compared to a certain, for example a predetermined, set-point by the controller 300. If necessary the mechanism 220 to regulate fluid flow is changed and so on. An embodiment of the invention can be used in any immersion lithographic or related machine or product where fast stable liquid flow control is required with minimal risks of contamination and/or with mK temperature stability requirements.

In an embodiment the first controller 300 is arranged to receive a signal indicative of fluid flow rate to the first component 12 from the flow sensor 310. The flow sensor 310 is arranged to measure the fluid flow rate at the first component 12. The feedback control of the first controller 300 is based on the signal from the flow sensor 310. In an embodiment the flow sensor 310 is a non-contact flow sensor which senses the flow rate without contacting the fluid.

In an embodiment desirably all components of the first fluid flow path 100 are made from fluorocarbon. The lack of active components and/or the use of fluorocarbon means there will be less contamination of fluid from the fluid source 120 as it passes through the first fluid flow path 100.

An embodiment is illustrated schematically in FIG. 7. Similar features take the same reference numbers as in FIG. 6 and are only referred to here if there are differences for example in location, structure and use. The embodiment of FIG. 7 is thus the same as the embodiment of FIG. 6 except as described below.

A liquid supply 120 supplies stably-conditioned liquid (e.g., ultra pure water) to node Y. This could be the same liquid supply as used to supply thermal conditioning liquid to an optical element of a lithographic projection apparatus. A counter-flow heat exchanger 140 is placed after node B to compensate for thermal variation due to time-varying heat losses. The counter-flow inlet of the heat exchanger 140 is connected to the liquid supply 120. A constant counter-flow may be used or a time-varying flow rate could be adopted if necessary.

The thermal behavior at nodes A, B, C, and G during oscillating flow is expected to be desirable in having a low thermal instability.

In FIG. 7 the logic of the first controller is illustrated. A flow rate set-point is decided. This is compared to the actual flow rate 310 as measured by the flow sensor 310. The mechanism 220 to regulate flow of fluid in the drain fluid flow path 200 is adjusted accordingly.

In an embodiment the fluid supply system is connected to a lithographic apparatus. The lithographic apparatus may comprise a fluid handling device (or structure) to supply fluid between a final element of a projection system and a substrate of the lithographic apparatus. The fluid handling device is connected to the fluid supply system.

As will be appreciated, any of the above described features can be used with any other feature and it is not only those combinations explicitly described which are covered in this application.

In an embodiment, there is provided a fluid supply system for a lithographic apparatus, comprising: a first fluid flow path for fluid between a fluid source and a first component; a drain fluid flow path for fluid flow from a junction in the first fluid flow path to a drain component; and a first controller configured to vary a fluid flow rate to the first component from the fluid source by regulating flow of fluid through the drain fluid flow path.

In an embodiment, the first fluid flow path comprises only passive components at least downstream of the junction. In an embodiment, the fluid supply system further comprises a mass flow controller in the drain fluid flow path. In an embodiment, the mass flow controller is continuously or semi-continuously variable. In an embodiment, the first controller is configured to regulate flow of fluid through the drain fluid flow path by controlling the mass flow controller. In an embodiment, the first controller is configured to regulate the flow of fluid through the drain fluid flow path based on feedback control. In an embodiment, the first controller is arranged to receive a signal indicative of fluid flow rate to the first component from a flow sensor to measure the fluid flow rate to the first component and the feedback control is based on that signal. In an embodiment, all components of the first fluid flow path are made from or are coated with a fluorocarbon. In an embodiment, the fluid supply system further comprises a heat exchanger in the first fluid flow path upstream of the first component. In an embodiment, the heat exchanger is downstream of the junction. In an embodiment, the fluid source provides heat exchange fluid to the heat exchanger to exchange heat with fluid in the first fluid flow path. In an embodiment, the fluid supply system further comprises a back pressure regulator downstream of the junction to maintaining the pressure of fluid at the junction substantially constant.

In an embodiment, there is provided a lithographic apparatus connected to the fluid supply system described herein. In an embodiment, the lithographic apparatus further comprises a fluid handling device to supply fluid between a final element of a projection system and a substrate, wherein the fluid handling device is connected to the fluid supply system.

In an embodiment, there is provided a method of varying the fluid flow rate to a component from a fluid source, the method comprising varying the fluid flow in a drain fluid flow path between a drain component and a junction in a first fluid flow path between the fluid source and the component.

In an embodiment, there is provided a device manufacturing method, comprising projecting a patterned beam of radiation onto a substrate through a fluid provided in a space adjacent the substrate, and varying the fluid flow rate to the space using a method described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid supply system for a lithographic apparatus, comprising:
    a first fluid flow path for fluid between a fluid source and a first component;
    a drain fluid flow path for fluid flow from a junction in the first fluid flow path to a drain component;
    a mass flow controller in the drain fluid flow path; and
    a first controller configured to vary a fluid flow rate to the first component from the fluid source by regulating flow of fluid through the drain fluid flow path.

2. The fluid supply system of claim 1, wherein the first fluid flow path comprises only passive components at least downstream of the junction.

3. The fluid supply system of claim 1, wherein the mass flow controller is continuously or semi-continuously variable.

4. The fluid supply system of claim 1, wherein the first controller is configured to regulate flow of fluid through the drain fluid flow path by controlling the mass flow controller.

5. The fluid supply system of claim 1, wherein the first controller is configured to regulate the flow of fluid through the drain fluid flow path based on feedback control.

6. The fluid supply system of claim 5, wherein the first controller is arranged to receive a signal indicative of fluid flow rate to the first component from a flow sensor to measure the fluid flow rate to the first component and the feedback control is based on that signal.

7. The fluid supply system of claim 6, wherein all components of the first fluid flow path are made from or are coated with a fluorocarbon.

8. The fluid supply system of claim 1, further comprising a heat exchanger in the first fluid flow path upstream of the first component.

9. The fluid supply system of claim 8, wherein the heat exchanger is downstream of the junction.

10. The fluid supply system of claim 8, wherein the fluid source provides heat exchange fluid to the heat exchanger to exchange heat with fluid in the first fluid flow path.

11. The fluid supply system of claim 1, further comprising a back pressure regulator downstream of the junction to maintain the pressure of fluid at the junction substantially constant.

12. A lithographic apparatus, comprising:
    a projection system configured to project a patterned beam of radiation onto a substrate; and
    a fluid supply system, comprising:
        a first fluid flow path for fluid between a fluid source and a first component;
        a drain fluid flow path for fluid flow from a junction in the first fluid flow path to a drain component; and
        a first controller configured to vary a fluid flow rate to the first component from the fluid source by regulating flow of fluid through the drain fluid flow path,
        wherein the first fluid flow path comprises only non-valve passive components at least downstream of the junction toward the first component.

13. The lithographic apparatus of claim 12, further comprising a fluid handling device to supply fluid between the projection system and the substrate, wherein the fluid handling device is connected to the fluid supply system.

14. A device manufacturing method, comprising:
    varying the fluid flow in a drain fluid flow path between a drain component and a junction in a first fluid flow path between a fluid source and a component to vary the fluid flow rate to the component from the fluid source, wherein the first fluid flow path comprises only non-valve passive components at least downstream of the junction toward the component; and
    projecting a patterned beam of radiation onto a substrate through a fluid provided in a space adjacent the substrate, and wherein varying the fluid flow rate to the component from the fluid source comprises varying the fluid flow rate to the space.

15. The lithographic apparatus of claim 12, further comprising a mass flow controller in the drain fluid flow path.

16. The lithographic apparatus of claim 15, wherein the first controller is configured to regulate flow of fluid through the drain fluid flow path by controlling the mass flow controller.

17. The lithographic apparatus of claim 12, wherein the first controller is configured to regulate the flow of fluid through the drain fluid flow path based on feedback control.

18. The lithographic apparatus of claim 17, wherein the first controller is arranged to receive a signal indicative of fluid flow rate to the first component from a flow sensor to measure the fluid flow rate to the first component and the feedback control is based on that signal.

19. The lithographic apparatus of claim 12, wherein all components of the first fluid flow path are made from or are coated with a fluorocarbon.

20. The lithographic apparatus of claim 12, further comprising a heat exchanger in the first fluid flow path upstream of the first component and downstream of the junction.

21. The lithographic apparatus of claim 12, further comprising a back pressure regulator downstream of the junction to maintain the pressure of fluid at the junction substantially constant.

\* \* \* \* \*